US010216054B2

(12) United States Patent
Ota (10) Patent No.: US 10,216,054 B2
(45) Date of Patent: Feb. 26, 2019

(54) DISPLAY DEVICE (71) Applicant: Japan Display Inc., Minato-ku (JP)

(72) Inventor: Takashi Ota, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/654,923

(22) Filed: Jul. 20, 2017

(65) Prior Publication Data

US 2018/0031882 A1 Feb. 1, 2018

(30) Foreign Application Priority Data

Jul. 26, 2016 (JP) .................................. 2016-146214

(51) Int. Cl.
G02F 1/1362 (2006.01)
H01L 51/00 (2006.01)
F21V 8/00 (2006.01)
G02F 1/03 (2006.01)

(52) U.S. Cl.
CPC .......... G02F 1/1362 (2013.01); G02B 6/0011 (2013.01); G02B 6/0078 (2013.01); H01L 51/0096 (2013.01); G02B 6/0036 (2013.01); G02B 6/0038 (2013.01); G02F 1/0311 (2013.01); G02F 1/136209 (2013.01)

(58) Field of Classification Search
CPC ....... G02B 6/78; G02B 6/0036; G02B 6/0038
USPC ................. 362/616, 619, 625, 626
See application file for complete search history.

(56) References Cited

U.S. PATENT DOCUMENTS

| 2008/0252818 | A1* | 10/2008 | Wu ...................... | G02B 6/0078 349/65 |
|---|---|---|---|---|
| 2011/0013421 | A1* | 1/2011 | Um ...................... | G02B 6/0078 362/612 |
| 2012/0195064 | A1 | 8/2012 | Oku et al. | |
| 2014/0347840 | A1* | 11/2014 | Lee ......................... | G02B 6/005 362/19 |
| 2015/0036313 | A1* | 2/2015 | Ookubo ................ | G02B 6/0061 362/19 |
| 2015/0309246 | A1* | 10/2015 | Wang ................... | G02B 6/0078 362/606 |
| 2015/0316705 | A1* | 11/2015 | Chen .................... | G02B 6/0063 362/613 |
| 2017/0176670 | A1* | 6/2017 | McCollum ........... | G02B 6/0078 |

FOREIGN PATENT DOCUMENTS

JP 2012-177881 A 9/2012

* cited by examiner

*Primary Examiner* — Laura Tso
(74) *Attorney, Agent, or Firm* — Oblon, McClelland, Maier & Neustadt, L.L.P.

(57) ABSTRACT

According to one embodiment, a display device includes a liquid crystal display panel and a backlight device. The backlight device includes a light guide plate opposed to the back surface of the liquid crystal display panel, and light sources opposed to a light incident surface of the light guide plate. The light guide plate includes divided light guide plates, each having a first main surface, a second main surface, the light incident surface, and side surfaces cross to the main surface and the light incident surface, and an adhesive member connecting the side surfaces of the divided light guide plates to each other and having optical properties different from optical properties of the divided light guide plates.

11 Claims, 9 Drawing Sheets

DISPLAY DEVICE

CROSS-REFERENCE TO RELATED APPLICATIONS

This application is based upon and claims the benefit of priority from Japanese Patent Application No. 2016-146214, filed Jul. 26, 2016, the entire contents of which are incorporated herein by reference.

FIELD

Embodiments described herein relate generally to a display device.

BACKGROUND

Recently, liquid crystal display devices have been widely used as display devices of portable devices such as smartphones and tablet computers or display devices of vehicle-mounted devices. In general, a liquid crystal display device comprises a liquid crystal display panel, and an illuminating device (backlight device) which is opposed to the back surface of the liquid crystal display panel and illuminates the liquid crystal display panel.

The illuminating device comprises a light guide plate having a light emission surface which is opposed to the liquid crystal display panel, an optical sheet which overlaps the light guide plate, a reflection sheet which is opposed to the back surface of the light guide plate, and a light source which emits light to the light incident surface (end surface) of the light guide plate. The light which has entered the light guide plate is repeatedly reflected inside the light guide plate and is emitted from the entire light emission surface toward the liquid crystal display panel.

Recently, in the display device, a method of increasing the contrast of a display image by individually controlling the light amounts of a plurality of light sources, that is, the so-called local dimming control has been proposed. However, in the liquid crystal display device, the light guide plate cannot sufficiently concentrate the light entering from the end surface thereof, and the light is emitted from the entire backlight, that is, from the entire light guide plate. Thus partial illumination is technically difficult. Therefore, it is difficult to perform the local dimming control in the above-described liquid crystal display device.

DETAILED DESCRIPTION

Various embodiments will be described hereinafter with reference to the accompanying drawings. In general, according to one embodiment, a display device comprises: a liquid crystal display panel comprising a display surface and a back surface opposite to the display surface; and a backlight device comprising a light guide plate, and light sources. The light guide plate comprises a first main surface opposed to the back surface of the liquid crystal display panel, a second main surface opposite to the first main surface, and end surfaces connecting the first main surface and the second main surface and including an end surface constituting a light incident surface, the light sources being opposed to the light incident surface. The light guide plate includes divided light guide plates, each having the first main surface, the second main surface, the light incident surface, side surface cross to the first main surface and the light incident surface, and an adhesive member connecting the side surfaces of the divided light guide plates to each other and has optical properties different from optical properties of the divided light guide plates.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

Embodiment

Figure 1:
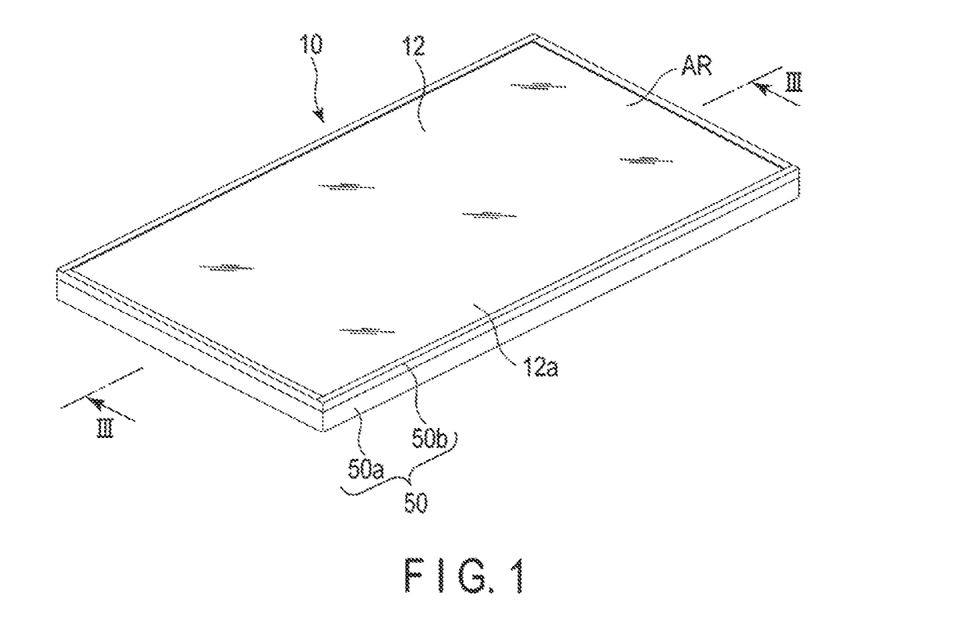
FIG. 1 is a perspective view of a display surface side of a liquid crystal display device according to an embodiment.
Figure 2:
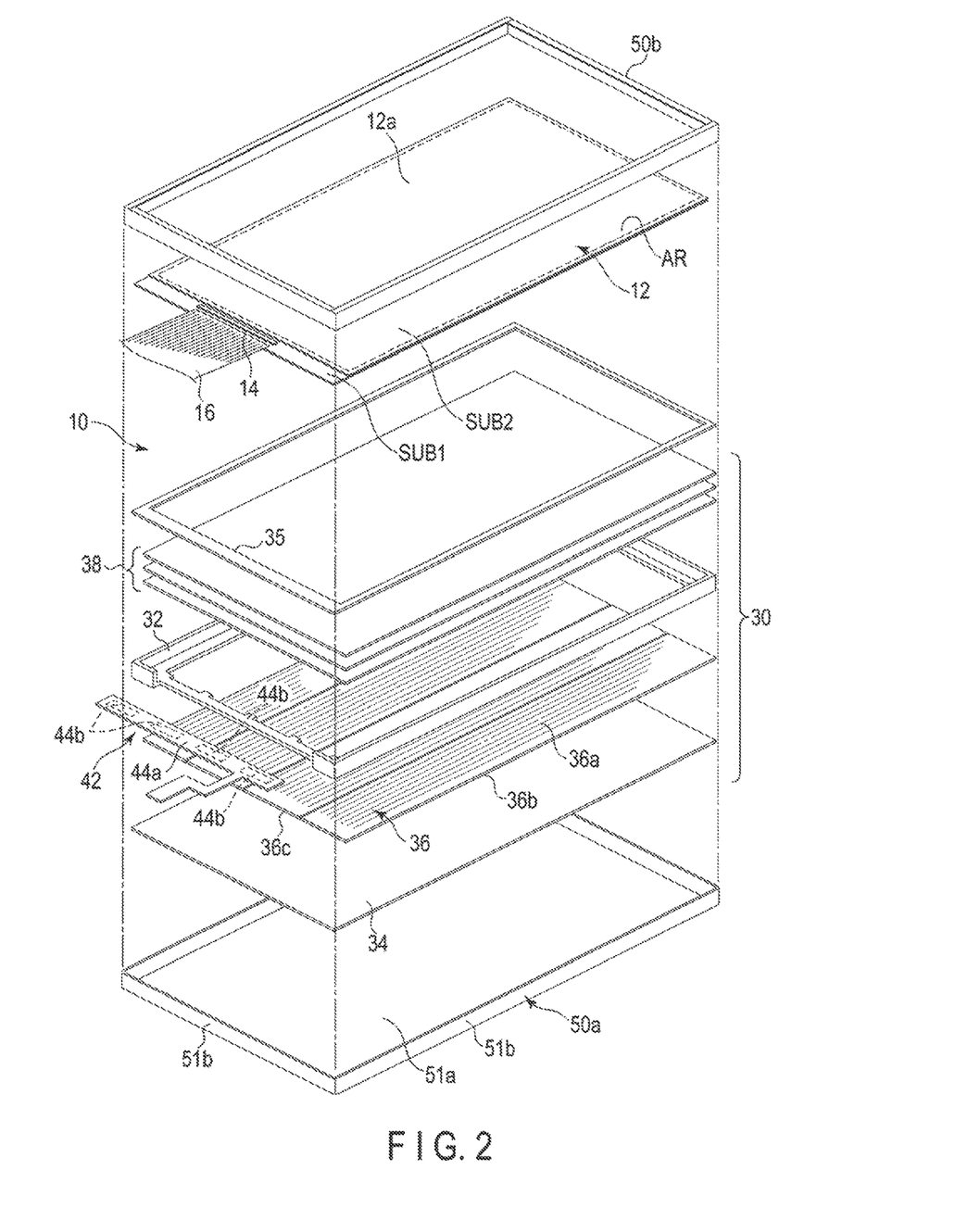
FIG. 2 is an exploded perspective view of the liquid crystal display device.
Figure 3:
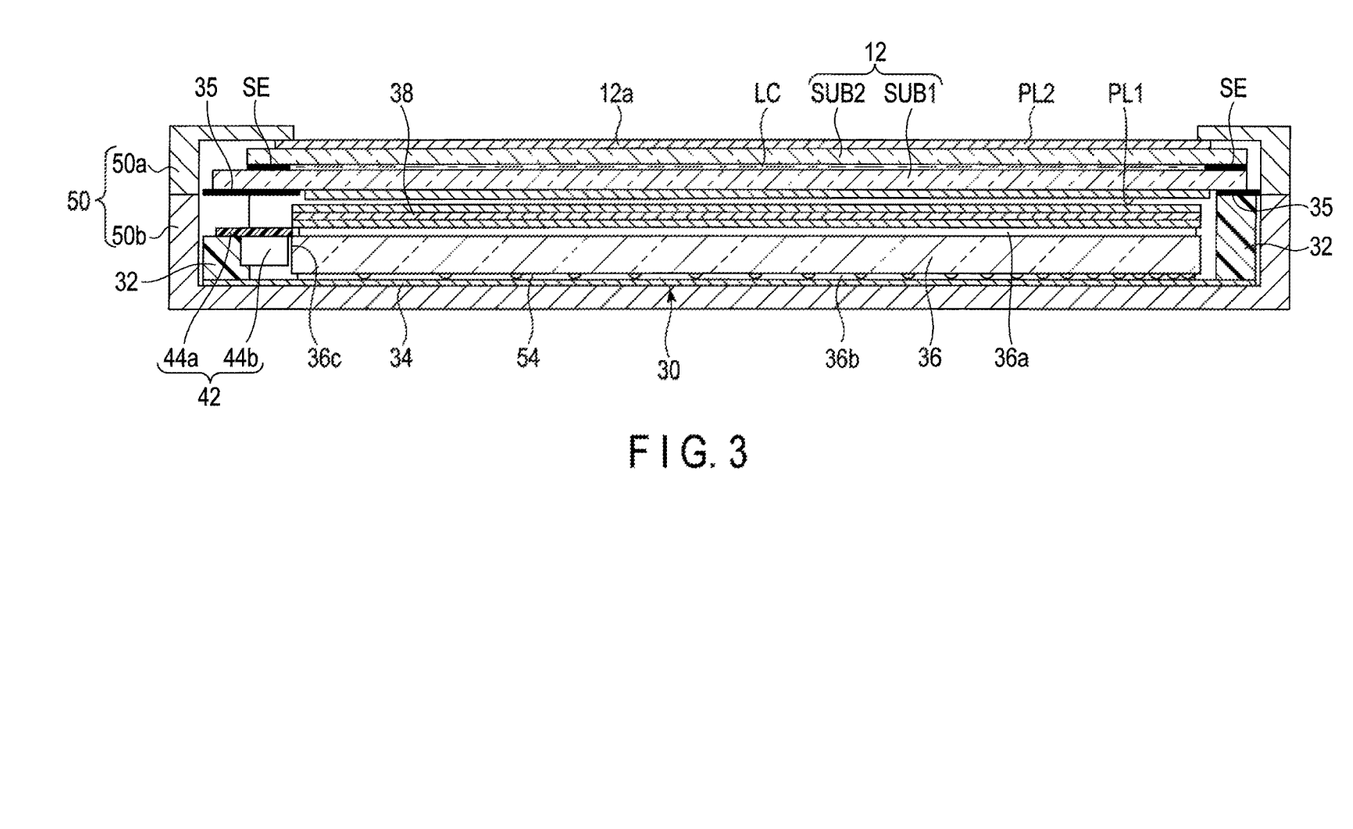
FIG. 3 is a longitudinal cross-sectional view of the liquid crystal display device taken along line of FIG. 1.

FIG. 1 is a perspective view of a display surface side of a liquid crystal display device of an embodiment, FIG. 2 is an exploded perspective view of the liquid crystal display device, and FIG. 3 is a cross-sectional view of the liquid crystal display device.

A liquid crystal display device 10 can be incorporated into various electronic devices such as a smartphone, a tablet computer, a mobile phone, a portable game console, an electronic dictionary and a television device, or vehicle-mounted devices such as a navigation system and a meter panel.

As shown in FIGS. 1 and 2, the liquid crystal display device 10 comprises an active-matrix liquid crystal display panel 12, a planar illuminating device (backlight device) 30 which is opposed to the back surface of the liquid crystal display panel 12, and an outer case 50 in which the liquid crystal display panel 12 and the backlight device 30 are accommodated in such a manner that a display surface 12a of the liquid crystal display panel 12 is exposed. The backlight device 30 illuminates the back surface side of the liquid crystal display panel 12 with planar light.

As shown in FIGS. 1 to 3, the liquid crystal display panel 12 comprises a first substrate SUB1 shaped in a rectangular flat plate, a second substrate SUB2 shaped in a rectangular flat plate and opposed to the first substrate SUB1, and a liquid crystal layer LC held between the first substrate SUB1 and the second substrate SUB2. The periphery of the second substrate SUB2 is adhered to the first substrate SUB1 with a sealing member SE. A polarizer PL2 is stuck on a surface of the second substrate SUB2 to form a display surface 12a of the display panel 12. A polarizer PL1 is stuck on a surface of the first substrate SUB1 (i.e., the back surface of the display panel 12).

In the liquid crystal display panel 12, the liquid crystal layer LC is provided in the region enclosed with the sealing member SE, and defines a rectangular effective display area (active area) AR. The liquid crystal display panel 12 is of a transmissive type having a transmissive display function of displaying an image by selectively transmitting the light from the backlight device 30 through the effective display area AR. Note that the liquid crystal display panel 12 may be of a transflective type having a transmissive display function and a reflective display function. The liquid crystal display panel 12 may have a structure conforming to a lateral electric field mode of mainly using a lateral electric field substantially parallel to the main surface of the substrate as a display mode, or may have a structure conforming to a vertical electric field mode of mainly using a vertical electric field substantially perpendicular to the main surface of the substrate as a display mode. Further, the liquid crystal display panel 12 may be a display panel including a touch sensor (not shown) and configured to input a touch operation.

In the example illustrated, the short side end of the first substrate SUB1 projects outward from the short side of the second substrate SUB2, and on the projecting short side end, a driver IC 14 as a driver element is mounted. A flexible printed circuit board (FPC) 16 is connected to the end of the first substrate SUB1 and extends outward from the liquid crystal display panel 12. The FPC 16 is electrically connected to the driver IC 14 via conductive lines.

Next, an example of the structure of the backlight device 30 will be described in detail. As shown in FIGS. 2 and 3, the backlight device 30 as a whole has a shape of a rectangular plate having substantially the same size as that of the liquid crystal display panel 12. The backlight device 30 comprises a rectangular support frame 32 formed of a synthetic resin, e.g., a reflection sheet 34 adhered to the back surface of the support frame 32, optical members which are arranged inside the support frame 32, and a light source unit 42 which supplies light to be emitted to the optical members. The support frame 32 is adhered to the periphery of the back surface of the first substrate SUB1 with, for example, a rectangular frame-shaped light-shielding tape 35. A reflection film may be formed on the inner surface of the side wall of the support frame 32, or the support frame 32 may be formed of a material having a light reflection function.

The optical members include a light guide plate 36 provided inside the support frame 32, and optical sheets 38 which are overlaid on the light guide plate 36. The light guide plate 36 has a shape of a rectangular plate, and includes a first main surface (light emission surface) 36a opposed to the liquid crystal display panel 12, a second main surface (reflection surface) 36b which is opposite to the first main surface and is opposed to the reflection sheet 34, and end surfaces (side surfaces) connecting the first main surface 36a and the second main surface 36b. The end surface (side surface) along one short side constitutes a light incident surface 36c.

The optical sheets 38 are light transmissive and are overlaid on the light emission surface 36a of the light guide plate 36. In the present embodiment, for example, a light diffusion sheet formed of a synthetic resin such as polyethylene terephthalate, two prism sheets, and the like are used as the optical sheets 38. These optical sheets 38 are rectangles having substantially the same dimensions as each other. Since the light diffusion sheet has low light diffusion properties, as the light is transmitted through the light diffusion sheet, the effect on the distribution of the light is reduced. As the light is transmitted through the prism sheets, the light can be concentrated into the front surface, and the brightness of the front surface can be increased.

The light source unit 42 includes an elongate circuit board 44a, and light sources mounted on the circuit board 44a, for example, light emitting diodes (LEDs) 44b. The circuit board 44a is attached to the support frame 32, and the LEDs 44b are opposed to the light incident surface 36c of the light guide plate 36. The LEDs 44b are arranged along the short side of the light guide plate 36, namely, the light incident surface 36c, and emit light to substantially the entire light incident surface 36c.

As the light is emitted from the LEDs 44b, the light enters the light guide plate 36 from the light incident surface 36c and travels through the light guide plate 36 in a first direction (longitudinal direction X) which is orthogonal to the light incident surface 36c. After the incident light is repeatedly reflected inside the light guide plate 36, the light is emitted from substantially the entire light emission surface 36a toward the liquid crystal display panel 12.

As shown in FIGS. 1 to 3, the outer case 50 includes, for example, a rectangular base frame 50a and a rectangular cover frame 50b which are formed of a metal plate of aluminum, stainless, iron or the like. The base frame 50a includes a rectangular bottom wall 51a which has dimensions (length and width) greater than those of the support frame 32 of the backlight device 30, and side walls 51b which stand along the respective side edges of the bottom wall. The cover frame 50b has the shape of a rectangular frame having dimensions (length and width) greater than those of the support frame 32.

The backlight device 30 is arranged within the base frame 50a, and the reflection sheet 34 and the support frame 32 are mounted on the bottom wall 51a of the base frame 50a. The cover frame 50b is provided over the periphery of the liquid crystal display panel 12 and is in contact with the side walls 51b of the base frame 50a. The cover frame 50b is fixed to the base frame 50a by a fastener member or an adhesive agent (not shown). Accordingly, the liquid crystal display panel 12 and the backlight device 30 are accommodated in the outer case 50 in such a manner that the display surface 12a of the liquid crystal display panel 12, more specifically, the effective display area AR excluding the periphery of the display surface 12a is exposed.

Next, an example of the structure of the light guide plate 36 in the backlight device 30 will be described in detail.

Figure 4:
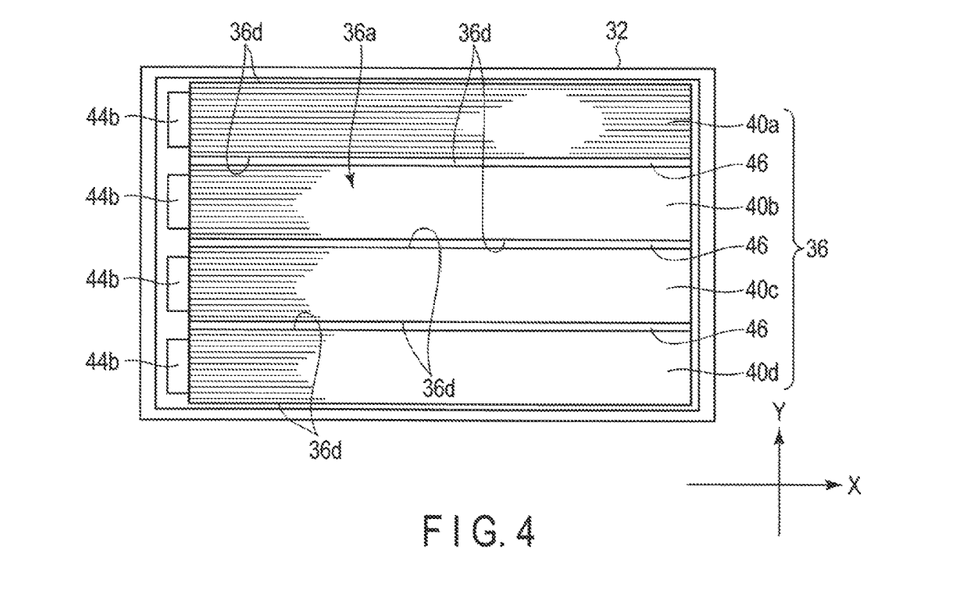
FIG. 4 is a schematic plan view of a light guide plate of a backlight device of the liquid crystal display device.
Figure 5:
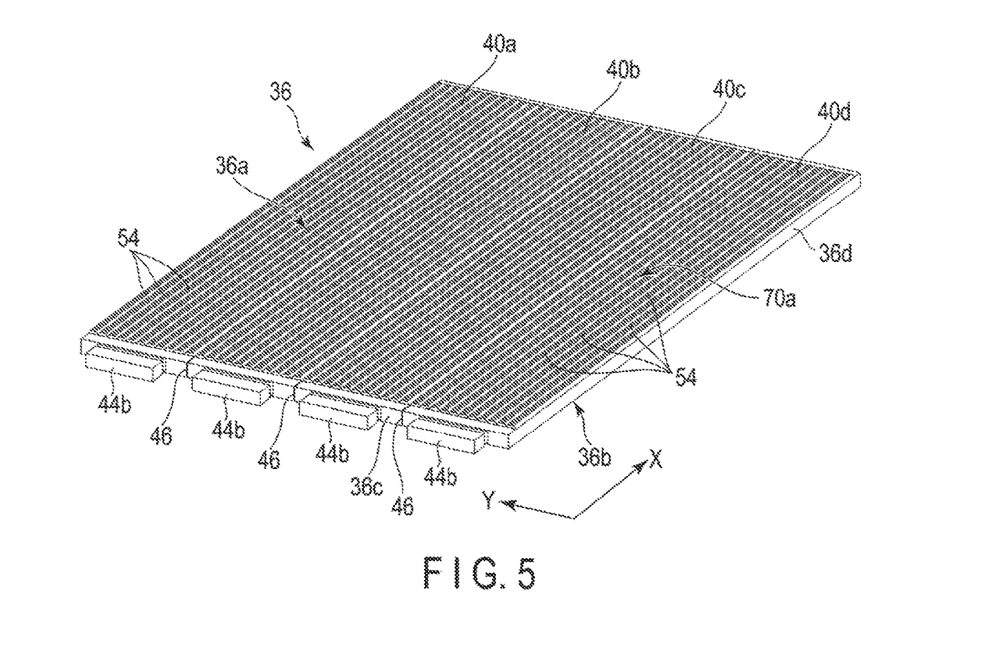
FIG. 5 is a perspective view of a light emission surface (first main surface) side of the light guide plate of the liquid crystal display device.
Figure 6:
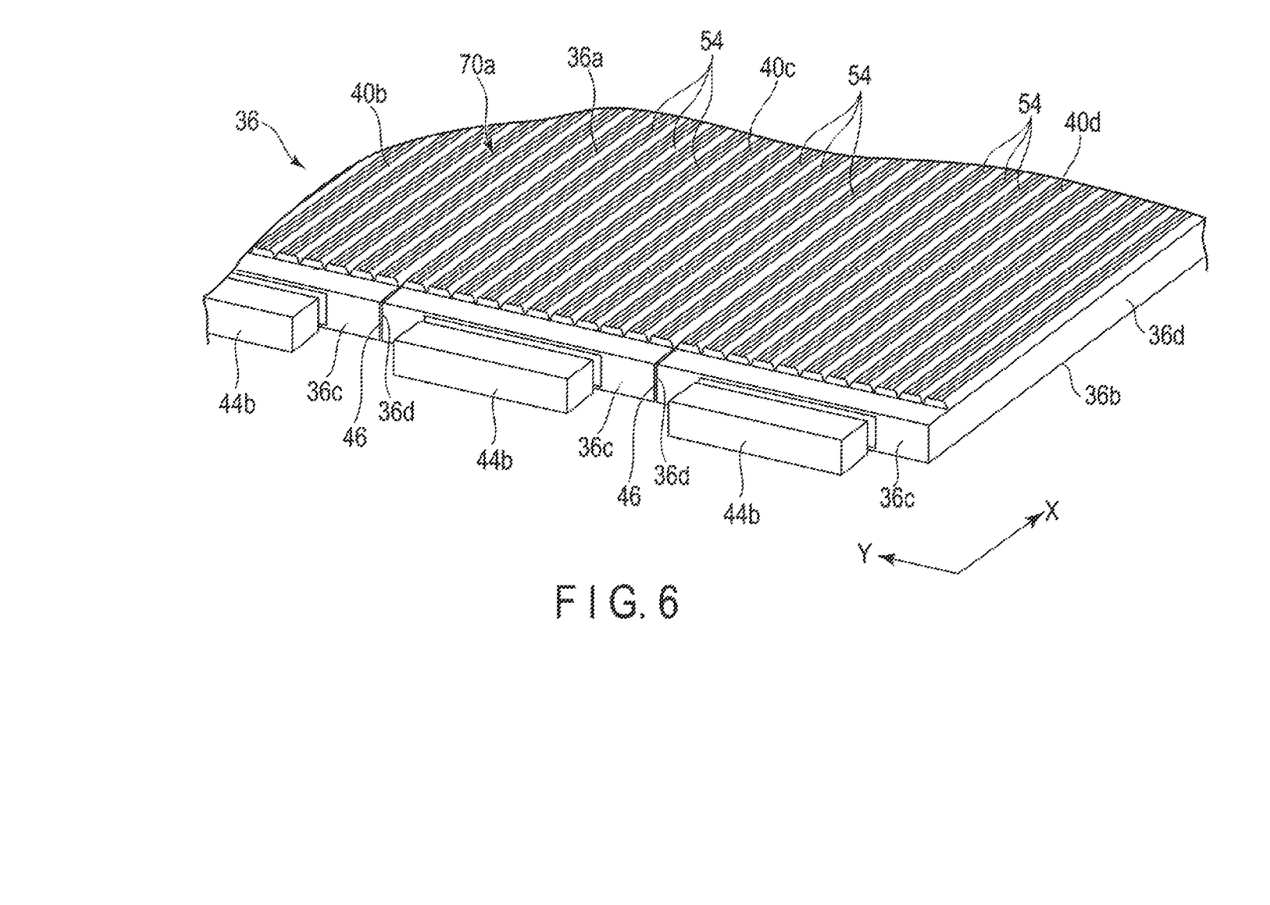
FIG. 6 is an enlarged perspective view of a part of a light emission surface (first main surface) of the light guide plate.

FIG. 4 is a schematic plan view of the backlight device 30, FIG. 5 is a perspective view of the light emission surface side of the light guide plate 36, and FIG. 6 is an enlarged perspective view of a part of the light emission surface side of the light guide plate 36.

As shown in FIGS. 4 and 5, the light guide plate 36 comprises several, for example, two to eight or more divided light guide plates in a shape of strip, and as the divided light guide plates are attached all together, thereby forming one light guide plate. In the example illustrated, the light guide plate 36 is formed of four divided light guide plates 40a, 40b, 40c and 40d. For example, each of the divided light guide plates 40a, 40b, 40c and 40d is formed of a transparent resin such as polycarbonate and is an elongated thin rectangle which extends in the longitudinal direction (first direction X). In the present embodiment, four divided light guide plates 40a, 40b, 40c and 40d have the same dimensions (length, width and thickness) as each other. The divided light guide plates 40a, 40b, 40c and 40d are arranged parallel to each other on the same plane, and further the two adjacent divided guide plates are attached to each other with an adhesive member, for example, an adhesive agent 46. That is, each of the divided light guide plates 40a to 40d has the rectangular first main surface 36a and second main surface 36b, the light incident surface 36c at one end in the longitudinal direction, and the pair of long side surfaces 36d which are orthogonal to the first main surface 36a and the light incident surface 36c. These four divided light guide plates 40a to 40d are arranged in such a manner that the first main surfaces 36a are flush with each other and the light incident surfaces 36c are flush with each other. In the divided light guide plates 40a to 40d, one side surface 36d of a divided light guide plate is opposed and parallel to the side surface 36d of an adjacent divided light guide plate, and these side surfaces 36d are adhered to each other with the adhesive agent 46. The gap between the side surfaces 36d of the divided light guide plates 40a to 40d is set to be less than or equal to 0.1 mm. Note that, as the divided light guide plates 40a, 40b, 40c and 40d, not only those which have the same width as each other but also those which have different widths from each other may be used.

The adhesive agent 46 is different from the divided light guide plates 40a to 40d in optical properties, for example, in refractive index. For example, the adhesive agent 46 is a transparent and has a refractive index lower than that of the divided light guide plates 40a to 40d. Note that the adhesive agent 46 may also be opaque or white and may also have a refractive index higher than that of the divided light guide plates 40a to 40d. The adhesive member is not limited to an adhesive agent and may also be an adhesive sheet, a double-faced tape, and the like.

The light source unit 42 includes four LEDs 44b corresponding to the four divided light guide plates 40a, 40b, 40c and 40d, and these LEDs 44b are opposed to the light incident surfaces 36c of the divided light guide plates 40a, 40b, 40c and 40d, respectively. Note that each LED 44b is not limited to one light emitting element and may also include a plurality of light emitting elements.

At least one of the first main surface 36a and the second main surface 36b of the light guide plate 36 includes a first recess/projection pattern 70a which comprises longitudinal projection streaks (longitudinal grooves). In the present embodiment, the first main surface (light emission surface) 36a includes the first recess/projection pattern 70a which includes longitudinal projection steaks (first protrusions) 54, and the second main surface (reflection surface) 36b includes a second recess/projection pattern 70b which includes dot-shaped or dorm-shaped second projections.

As shown in FIGS. 4 to 6, the first recess/projection pattern 70a formed on the first main surface 36a of the divided light guide plates 40a to 40d includes the longitudinal projection streaks 54 which extend in the traveling direction of the incident light, that is, in the first direction X orthogonal to the light incident surface 36c. Each longitudinal projection streak 54 extends throughout the length of the light guide plate 36 in the longitudinal direction from the vicinity of the light incident surface 36c to the vicinity of the other short side of the light guide plate 36. The longitudinal projection streaks 54 are arranged at regular intervals in the width direction of the light guide plate 36 (direction parallel to the light incident surface 36c) and have a pitch of, for example, 100 μm.

With respect to the area of the first main surface 36a, the occupancy rate (density) of the longitudinal projection streaks 54 is set to be in a range of 50 to 80% and is set to be 80% in the present embodiment.

Note that the longitudinal projection streaks are projections when viewed from the outside of the light guide plate 36, but when viewed from the inside of the light guide plate 36, the longitudinal projection streaks will be recess and may be referred to also as longitudinal grooves.

Figure 7A:
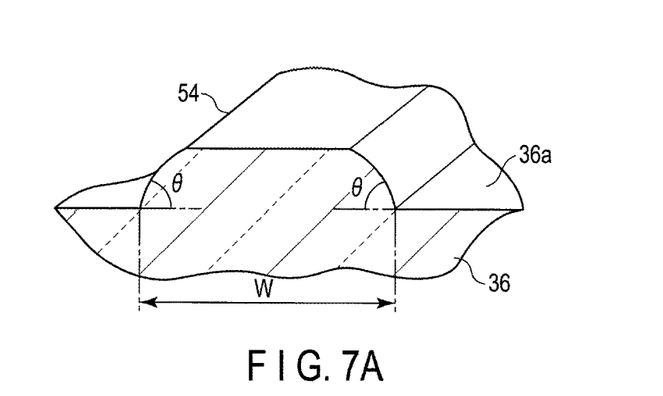
FIG. 7A is a schematic view of the shape of a cross-section of a longitudinal projection streak of the light guide plate.
Figure 7B:
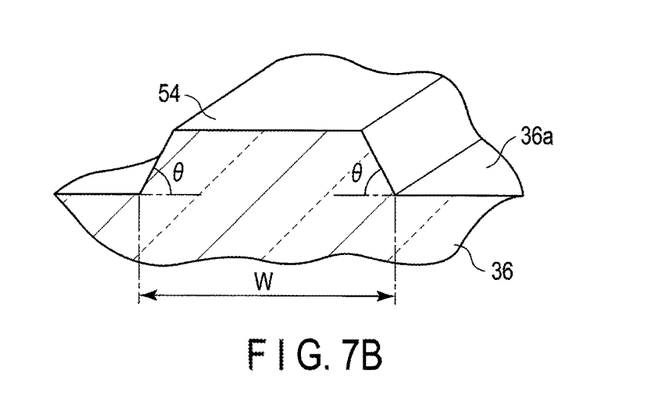
FIG. 7B is a schematic view of the shape of a cross-section of a longitudinal projection streak of the light guide plate.
Figure 7C:
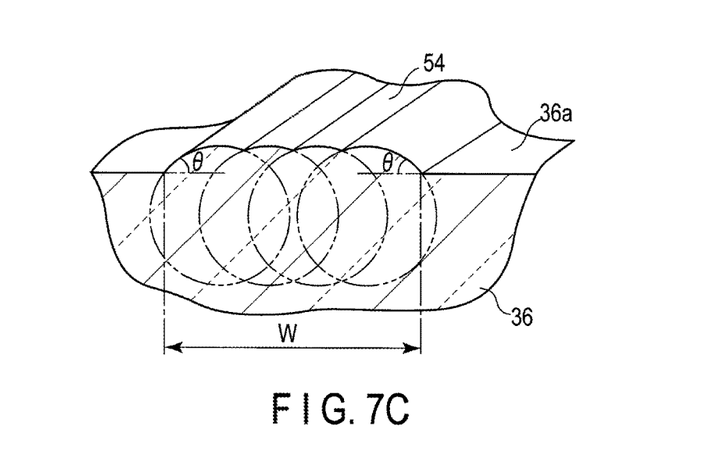
FIG. 7C is a schematic view of the shape of a cross-section of a longitudinal projection streak of the light guide plate.

FIGS. 7A, 7B and 7C are schematic views of the cross-sectional shapes of the longitudinal projection streak 54 of the light guide plate 36. The cross-section of the longitudinal projection streak 54 may have the shape of a truncated semicircle such as that shown in FIG. 7A where an upper portion of a semicircle is truncated by a plane, the shape of a trapezoid such as that shown in FIG. 7B, or the shape of truncated circular arcs such as that shown in FIG. 7C where the convex ceiling (the bottom of the groove) is composed of, for example, four truncated circular arcs arranged in the width direction of the projection streak. In the present embodiment, the shape of truncated circular arcs such as that shown in FIG. 7C is adopted. According to the shapes of the cross-sections shown in FIGS. 7A, 7B and 7C, the height of the projection of the longitudinal projection streak 54 can be reduced, and consequently the thickness of the entire light guide plate 36 can be reduced.

As shown in FIGS. 7A to 7C, the longitudinal projection streak 54 have a width W of, for example, 100 μm. Further, an angle (contact angle) θ between each side surface (standing surface) of the longitudinal projection streak 54 and the flat surface (first main surface 36a) of the light guide plate 36 is set to be in a range of 45 to 70 degrees, and is, for example, 60 degrees in the present embodiment. If the cross-sectional shape of the longitudinal projection streak 54 is such a shape as that shown in FIG. 7C where several circular arcs having a diameter less than a half of the width W of the longitudinal projection streak 54 are arranged in the width direction of the projection streak, a longitudinal projection streak 54 which has a low projection height and a large contact angle θ can be easily formed.

Figure 8:
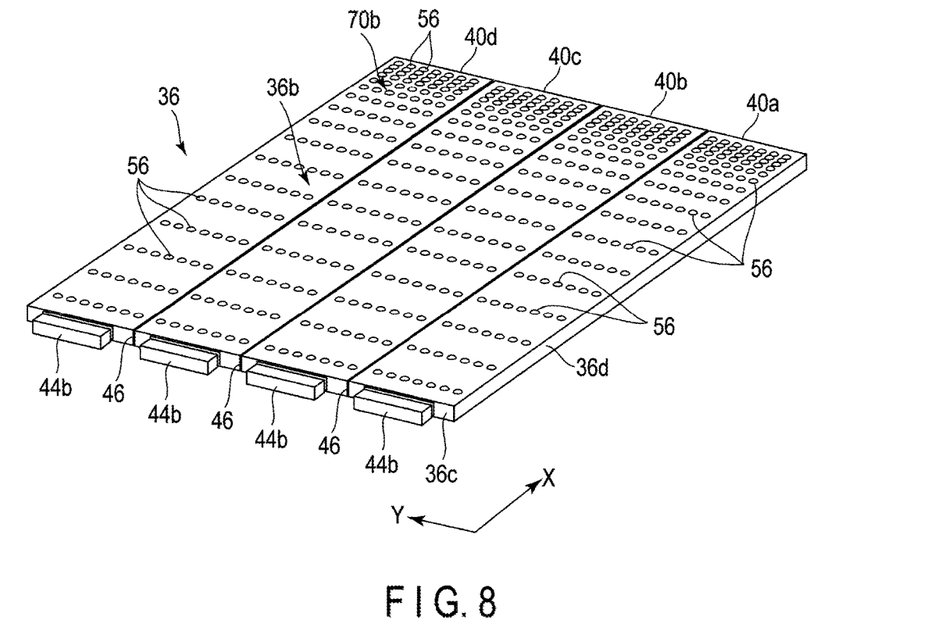
FIG. 8 is a perspective view of a reflection surface (second main surface) side of the light guide plate.
Figure 9:
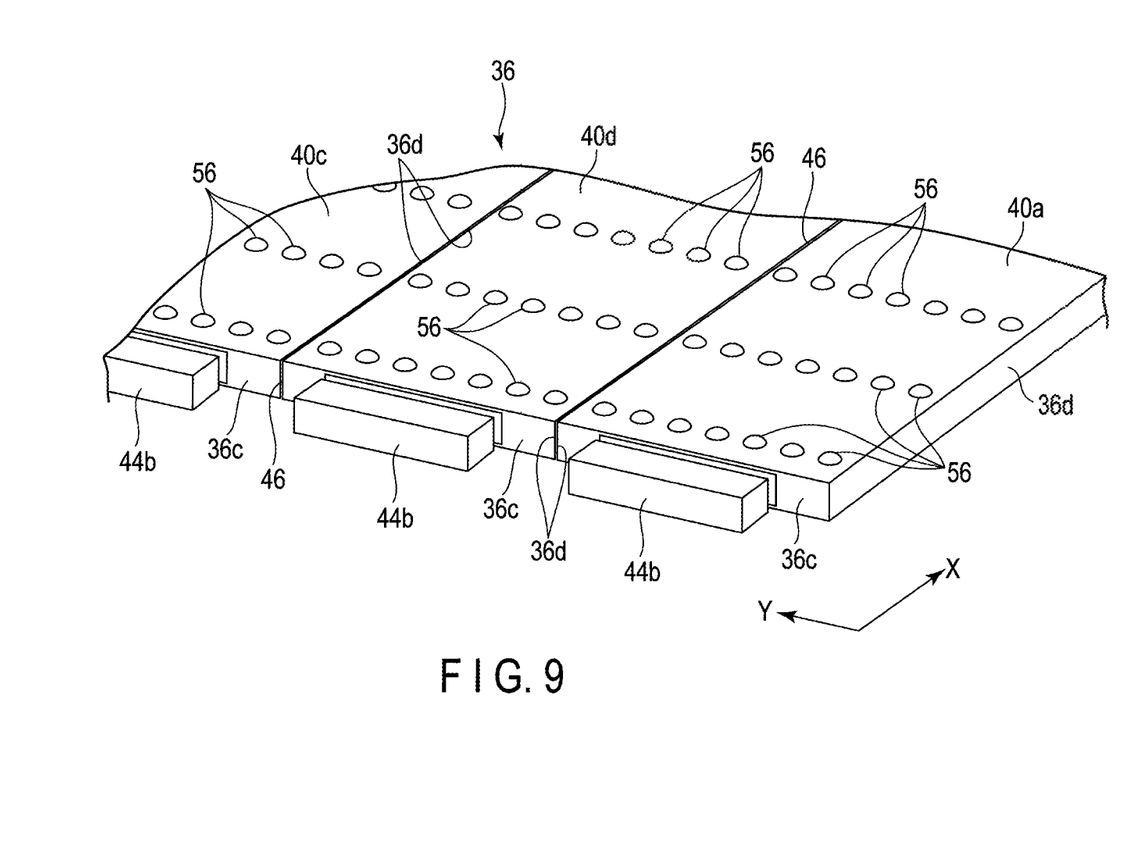
FIG. 9 is an enlarged perspective view of a part of a reflection surface (second main surface) of the light guide plate.
Figure 10:
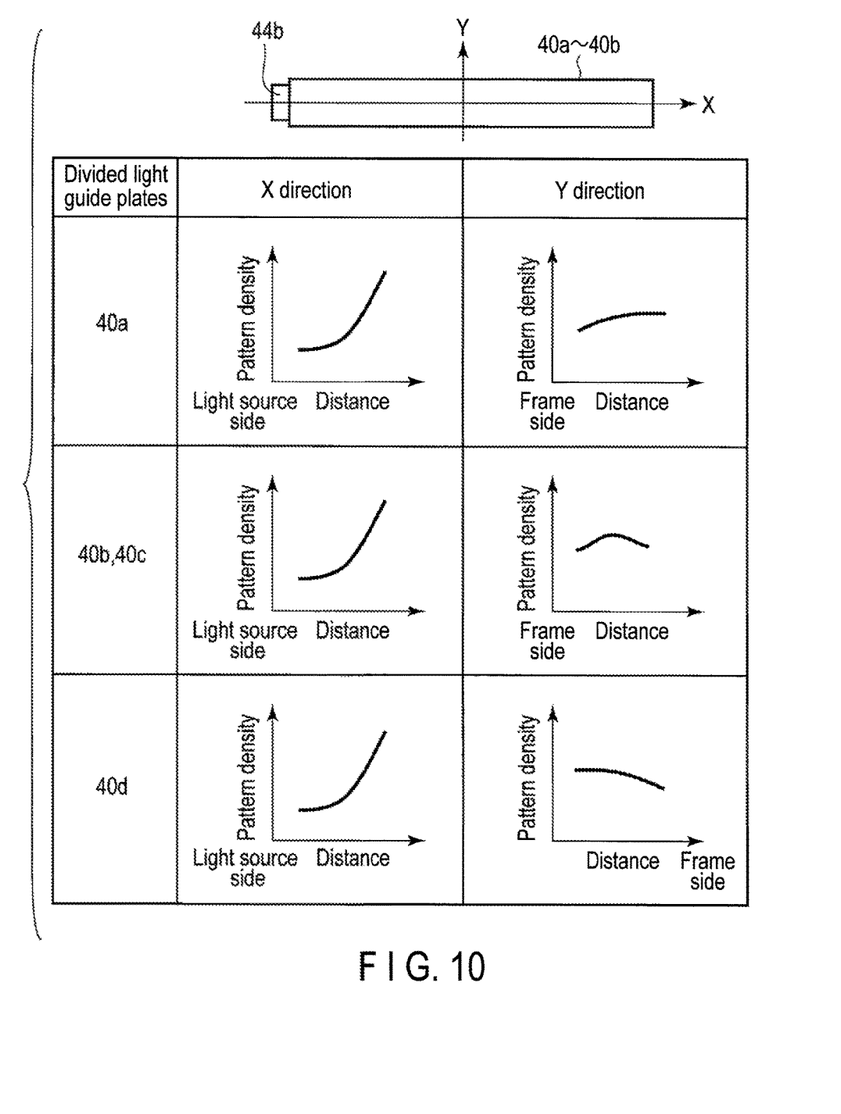
FIG. 10 is a schematic diagram showing the pattern density distribution of a second recess/projection pattern on the reflection surface of the light guide plate.

FIG. 8 is a perspective view of the reflection surface side of the light guide plate 36, FIG. 9 is an enlarged perspective view of the reflection surface side of the light guide plate 36, and FIG. 10 is a diagram showing the pattern density distribution of the second pattern on the second main surface of the light guide plate in the first direction X and the second direction Y.

As shown in FIGS. 8 and 9, the second recess/projection pattern 70b formed on the second main surface 36b (of each of the divided light guide plates 40a to 40d) of the light guide plate 36 includes dot-like or hemispherical second projections 56 which are provided on the second main surface 36b. In each of the divided light guide plates 40a to 40d, the numerous second projections 56 are arranged in the first direction X (longitudinal direction) and the second direction Y (width direction) of the light guide plate 36 from the vicinity of the light incident surface 36c to the vicinity of the other short side of the divided light guide plate.

As shown in FIGS. 8 to 10, in each of the divided light guide plates 40a to 40d, the pattern density (pattern arrangement density) of the second projections 56 arranged in the first direction X gradually increases from the vicinity of the light incident surface 36c to the vicinity of the other short side of the divided light guide plate, that is, gradually increases with increasing distance from the light source (LED) 44b and becomes the highest on the other short side of the divided light guide plate. Further, the pattern density (pattern arrangement density) of the second projections 56 arranged in the second direction (width direction) Y varies among the divided light guide plates 40a to 40d. That is, in the two divided light guide plates 40b and 40c located in the center of the light guide plate 36, the pattern density of the second projections 56 in the second direction Y becomes high in the center in the width direction and gradually decreases toward the both end sides in the width direction.

In the divided light guide plate 40a located on the one end side of the light guide plate 36 in the second direction Y, the pattern density of the second projections 56 arranged in the second direction Y gradually increases from the outer side toward the center, that is, from the support frame 32 side toward the center of the light guide plate 36. Further, in the divided light guide plate 40d located on the other end side of the light guide plate 36 in the second direction Y, the pattern density of the second projections 56 arranged in the second direction Y gradually decreases from the center of the light guide plate 36 toward the outer side, that is, from the center of the light guide plate 36 toward the support frame 32 side.

In this way, in the divided light guide plates 40a and 40d located on the both end sides of the light guide plate 36 in the width direction (second direction Y), the pattern density in the region on the support frame 32 side is reduced, and the pattern density in the center of the light guide plate 36 is increased. This is because, since a reflection film is formed on the inner surface of the support frame 32 and is opposed to the side surfaces of the divided light guide plates 40a and 40d, the reflectivity of the support frame side of the divided light guide plates 40a and 40d becomes higher than the reflectivity of the center side of the divided light guide plates 40a and 40d. Therefore, as described above, the pattern density of the second projections 56 of the support frame 32 side is set to be lower than that of the center side, and the reflectivity of the divided light guide plates 40a and 40b in the second direction Y becomes uniform.

Since the pattern density of the second recess/projection pattern 70b on the second main surface 36b of the light guide plate 36 is determined as described above in the first direction X and the second direction Y, the reflectivity will be substantially uniform on the entire second main surface 36b.

According to the backlight device 30 comprising the light guide plate 36 having the above-described structure, the light guide plate 36 is divided into the divided light guide plates 40a to 40d, and as the divided light guide plates are attached all together with the adhesive member 46 having a refractive index different from that of the divided light guide plates, the divided light guide plates 40a to 40d constitute one light guide plate 36. When light is emitted from the LEDs 44b and enters the divided light guide plates 40a to 40d, the light is repeatedly reflected inside and transmitted through the divided light guide plates 40a to 40d and reflected and diffused by the adhesive member 46 at the boundaries between the divided light guide plates. Accordingly, the light which is emitted from the LEDs 44b into the divided light guide plates 40a to 40d can be concentrated, transmitted in the first direction X, and prevented from diffusing in the second direction Y.

In the present embodiment, since the first recess/projection pattern 70a including the numerous longitudinal projection streaks 54 is formed on the first main surface 36a of each of the divided light guide plates 40a to 40d, it is possible to prevent the light from diffusing and concentrate the light more effectively by increasing the effect of the longitudinal projection streaks 54 on the incident light.

According to the liquid crystal display device with the above-described structure, in the case of partial illumination of the LEDs 44b, it is possible to prevent the light emitted from the on-state LEDs to the divided light guide plates 40a to 40b from diffusing and concentrate the light into the region to which the light is emitted (inside the divided light guide plate to which the light is emitted). Therefore, it is possible to prevent the light from diffusing into the surrounding region and illuminate only the desired region of the liquid crystal display panel 12 with the light. Consequently, it becomes possible to obtain a liquid crystal display device which can increase the contrast of an image display by applying the local dimming control.

Further, in the present embodiment, the light guide plate comprises four divided light guide plates, but the light guide plate is not limited to this and may also comprise two or five or more of the divided light guide plates. In that case, one or a plurality of light sources (LEDs) may be provided for each divided light guide plate, or one or a plurality of light sources (LEDs) may be provided for a plurality of light guide plates. Further, the second recess/projection pattern on the second main surface of the light guide plate is not limited to dot-shaped or ball-shaped projections but may also be longitudinal projection streaks or lateral projection streaks similar to those of the first recess/projection pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Further, all possible structures which a person having ordinary skill in the art can implement by making an appropriate change in design based on each structure described above as the embodiment of the present invention will come within the scope of the present invention as long as they fall within the scope and spirit of the present invention. For example, the liquid crystal display panel and the light emission surface of the light guide plate are not necessarily flat but may also be curved in such a way as to have convex or concave longitudinal cross-section or cross section. The shapes of the structural elements of the liquid crystal display panel and the backlight device are not limited to rectangles and may also include polygons with five or more sides, ellipses, track shapes, and various other shapes. Further, the materials of the structural members are not limited to those described above and may also be selected from various other materials.

Still further, concerning advantages other than those of the above-described embodiment or modification, advantages obvious from the description of the present invention and advantages appropriately conceivable by a person having ordinary skill in the art will be regarded as the advantages achievable from the present invention as a matter of course.

What is claimed is:

1. A display device comprising:
a liquid crystal display panel comprising a display surface and a back surface opposite to the display surface; and
a backlight device comprising a light guide plate including a first main surface opposed to the back surface of the liquid crystal display panel, a second main surface opposite to the first main surface, and end surfaces connecting the first main surface and the second main surface and including an end surface constituting a light incident surface, and light sources opposed to the light incident surface, wherein
the light guide plate comprises divided light guide plates, each comprising the first main surface, the second main surface, the light incident surface, and side surfaces cross to the first main surface and the light incident surface; and an adhesive member connecting the side surfaces of the divided light guide plates to each other and having optical properties different from optical properties of the divided light guide plates,
the first main surface includes a plurality of projection streaks extending in a traveling direction of light entering from the light incident surface, and
a cross-section of each of the projection streaks has a truncated semicircle shape which is formed of a plurality of circular arcs arranged in a width direction of the projection streak.

2. The display device of claim 1, wherein
a refractive index of the adhesive member is different from a refractive index of the divided light guide plates.

3. The display device of claim 2, wherein
the refractive index of the adhesive member is less than the refractive index of the divided light guide plates.

4. The display device of claim 1, wherein
the backlight device comprises light sources opposed respectively to the light incident surfaces of the divided light guide plates.

5. The display device of claim 1, wherein
the light guide plate includes a second recess/projection pattern on the second main surface,
the second recess/projection pattern includes dot-shaped or dome-shaped second projections on the second main surface, and
in each of the divided light guide plates, a pattern arrangement density of the second projections increases from the light incident surface side in the first direction orthogonal to the light incident surface.

6. The display device of claim 5, wherein
in each of the divided light guide plates, the pattern arrangement density of the second recess/projection patterns varies in a second direction orthogonal to the first direction.

7. The display device of claim 1, wherein
the light guide plate comprises four divided light guide plates, each comprising the first main surface, the second main surface, the light incident surface, and side surfaces orthogonal to the first main surface and the light incident surface, and an adhesive member connecting the side surfaces of the divided light guide plates to each other and having optical properties different from optical properties of the divided light guide plates, and
the backlight device comprises light sources respectively opposed to the light incident surfaces of the four divided light guide plates.

8. A display device comprising:
a liquid crystal display panel; and
a backlight device illuminating the liquid crystal display panel with light, wherein
the backlight device comprises a light source and light guide plates,
each of the light guide plates comprises a first main surface, a second main surface opposed to the first main surface, and side surfaces between the first main surface and the second main surface, one of the side surfaces constituting a light incident surface opposed to the light source,
the adjacent two light guide plates are arranged such that the side surfaces are opposed to each other and the two opposed side surfaces are attached to each other with an adhesive member,
a refractive index of the adhesive member is less than a refractive index of the light guide plates,
the first main surface includes a plurality of projection streaks extending in a traveling direction of light entering from the light incident surface, and
a cross-section of each of the projection streaks has a truncated semicircle shape which is formed of a plurality of circular arcs arranged in a width direction of the projection streak.

9. The display device of claim 8, wherein
each of the light guide plates comprises one side surface constituting a light incident surface, which is not attached to the adhesive member, and
light emitted from the light source enters the light guide plates from the light incident surfaces.

10. A display device comprising:
a liquid crystal display panel; and
a backlight device illuminating the liquid crystal display panel with light, wherein
the backlight device comprises a light source and light guide plates,
each of the light guide plates comprises a rectangular first main surface, a second main surface opposed to the first main surface, and side surfaces connecting the first main surface and the second main surface, one of the side surfaces constituting a light incident surface opposed to the light source,
the first main surface includes a pair of long sides opposed to each other and a pair of short sides opposed to each other,
the light guide plates are joined to one another such that side surfaces along the long sides of adjacent light guide plates are adhered to each other with an adhesive member,
the adhesive member has a refractive index less than a refractive index of the light guide plates,
the first main surface includes a plurality of projection streaks extending in a traveling direction of light entering from the light incident surface, and
a cross-section of each of the projection streaks has a truncated semicircle shape which is formed of a plurality of circular arcs arranged in a width direction of the projection streak.

11. The display device of claim 10, wherein
the light guide plates comprise side surfaces along the short sides which are not attached to each other with the adhesive member as light incident surfaces, and
light emitted from the light source enters the light guide plates from the light incident surfaces.

\* \* \* \* \*